(12) United States Patent
Min et al.

(10) Patent No.: US 10,580,967 B2
(45) Date of Patent: Mar. 3, 2020

(54) MAGNETIC TUNNEL JUNCTION DEVICE AND MAGNETIC RANDOM ACCESS MEMORY

(71) Applicant: XI'AN JIAOTONG UNIVERSITY, Xi'an, Shaanxi (CN)

(72) Inventors: Tai Min, San Jose, CA (US); Xue Zhou, Shaanxi (CN); Lin Zhang, Shaanxi (CN); Lei Wang, Shaanxi (CN)

(73) Assignee: XI'AN JIAOTONG UNIVERSITY, Xi'an, Shaanxi (CN)

( * ) Notice: Subject to any disclaimer, the term of this patent is extended or adjusted under 35 U.S.C. 154(b) by 0 days.

(21) Appl. No.: 16/127,231

(22) Filed: Sep. 11, 2018

(65) Prior Publication Data
US 2019/0027680 A1 Jan. 24, 2019

(30) Foreign Application Priority Data
Jul. 6, 2018 (CN) .......................... 2018 1 0738861

(51) Int. Cl.
| | |
|---|---|
| H01L 43/02 | (2006.01) |
| H01L 43/10 | (2006.01) |
| H01L 43/08 | (2006.01) |
| G11C 11/16 | (2006.01) |
| H01L 27/22 | (2006.01) |

(52) U.S. Cl.
CPC ........... *H01L 43/02* (2013.01); *G11C 11/161* (2013.01); *H01L 43/08* (2013.01); *H01L 43/10* (2013.01); *H01L 27/228* (2013.01)

(58) Field of Classification Search
None
See application file for complete search history.

(56) References Cited

U.S. PATENT DOCUMENTS

| | | | | |
|---|---|---|---|---|
| 6,469,926 | B1 * | 10/2002 | Chen ...................... | B82Y 25/00 360/324.11 |
| 6,750,068 | B2 * | 6/2004 | Chen ...................... | B82Y 25/00 438/3 |
| 9,093,640 | B2 * | 7/2015 | Aggarwal ............... | H01L 43/12 |
| 10,062,839 | B2 * | 8/2018 | Deshpande ............. | H01L 43/12 |
| 10,230,046 | B2 * | 3/2019 | Aggarwal ............... | H01L 43/12 |
| 10,483,460 | B2 * | 11/2019 | Nagel ..................... | H01L 43/12 |
| 2005/0157544 | A1 * | 7/2005 | Min ........................ | B82Y 25/00 365/171 |

(Continued)

*Primary Examiner* — David E Graybill

(57) ABSTRACT

A magnetic tunnel junction device includes a pinned magnetic layer, a free magnetic layer embodied as a synthetic antiferromagnetic device, and a nonmagnetic barrier layer sandwiched between the pinned magnetic layer and the free magnetic layer. The free magnetic layer includes a first ferromagnetic layer, a second ferromagnetic layer and a nonmagnetic spacing layer sandwiched between them; and can transform from the antiferromagnetic state to the ferromagnetic state regulated by electric field. Under the coaction of the electric field and the current, the ferromagnetic layer close to the barrier layer of the magnetic tunnel junction is switched to write in data. Also, a magnetic random access memory based on a synthetic antiferromagnetic free layer can write in data under the coaction of the electric field and the current, and has advantages such as simple structure, low power consumption, rapid speed, radiation resistant, and non-volatility.

7 Claims, 4 Drawing Sheets

(56) References Cited

U.S. PATENT DOCUMENTS

| | | | |
|---|---|---|---|
| 2007/0008661 A1* | 1/2007 | Min | ........................ B82Y 25/00 |
| | | | 360/324.1 |
| 2011/0284977 A1* | 11/2011 | Min | ........................ B82Y 25/00 |
| | | | 257/421 |
| 2014/0220707 A1* | 8/2014 | Aggarwal | ............... H01L 43/12 |
| | | | 438/3 |

* cited by examiner

MAGNETIC TUNNEL JUNCTION DEVICE AND MAGNETIC RANDOM ACCESS MEMORY

CROSS REFERENCE OF RELATED APPLICATION

The present invention claims priority under 35 U.S.C. 119(a-d) to CN 201810738861.8, filed Jul. 6, 2018.

BACKGROUND OF THE PRESENT INVENTION

Field of Invention

The present invention relates to the circuits and devices having magnetic or ferromagnetic materials or structures and the applications thereof, and more particularly to an electrical-assist-controlled magnetic random access memory based on a synthetic antiferromagnetic free layer which is controlled by an electric field and uses the electric field for auxiliary erasing.

Description of Related Arts

The magnetic tunnel junction (MTJ) comprises two layers of magnetic metal (such as Fe, Co and Ni) and an ultra-thin insulation layer (such as aluminum oxide and magnesium oxide) sandwiched between the two layers of magnetic metal. If a bias voltage is applied between the two layers of magnetic metal, the insulation layer is very thin, so electrons are able to pass through the potential barrier by the tunneling effect. Under a given bias voltage, the tunnel current and the tunneling resistance are determined by the relative magnetization direction of two ferromagnetic layers, which is defined as tunneling magnetoresistance (TMR) to reflect the spin-dependent tunneling effect. The relative magnetization direction of the two ferromagnetic layers is able to be changed by the applied electric field or charge current.

The spin valve is made from two or more conductive magnetic materials, and its resistance is able to be changed between two values (high-resistance and low-resistance) in accordance with the relative magnetization direction of different layers. The giant magnetoresistive (GMR) effect results in the resistance variation. In the simplest case, the spin valve comprises two ferromagnetic layers and a non-magnetic layer sandwiched between the two ferromagnetic layers, wherein one ferromagnetic layer (defined as the first ferromagnetic layer) is pinned by an antiferromagnetic body for improving the magnetic coercivity of the first ferromagnetic layer, so that the first ferromagnetic layer is expressed as a "hard" magnetic layer; and the other ferromagnetic layer (defined as the second ferromagnetic layer) is changeable in magnetization direction to be expressed as a "soft" magnetic layer. The two ferromagnetic layers are separated from each other by the nonmagnetic layer, so that one of the two ferromagnetic layers remains free in magnetization direction (which is defined to be soft magnetism). Due to different coercivity, the soft magnetic layer is able to be changed in polarity under the lower applied magnetic field or charge current intensity; and at this time, the direction of magnetization of hard magnetic layer is unchanged. Therefore, through applying the external magnetic field with appropriate intensity, the polarity of the soft magnetic layer is able to be changed, so that the spin valve has two different states, that is, the low-resistance state in which the magnetization directions of the two magnetic layers are parallel to each other, and the high-resistance in which the magnetization directions of the two magnetic layers are antiparallel to each other.

Today, magnetic junctions (called as MJs, comprising MTJs and spin valves) are commonly used in magnetic random access memories. Magnetic random access memories have attracted great attention in the industrial field due to their advantages such as non-volatility, excellent durability, high read and write speed, and low power consumption. A magnetoresistance element in a magnetic random access memory (MRAM) may be a magnetic junction comprising two or more ferromagnetic thin films. The resistance of the MJ depends on the relative magnetization direction of the pinned magnetic layer and the free magnetic layer. The direction of magnetization of the free magnetic layer (FL) is able to be switched between two stable directions, and the resistances of the MJ are two values for two relative magnetic directions of the pinned magnetic layer and the free magnetic layer, so as to respectively represent the binary states "1" and "0" of the data states, thereby being applied to the binary logic. The magnetization direction of the free magnetic layer of the magnetic junction is changed by an external magnetic field, so as to obtain a low-resistance state (binary state "1") or a high-resistance state (binary state "0") respectively corresponding to the parallel or antiparallel magnetization directions of the free magnetic layer and the pinned magnetic layer, for further obtaining the binary state "1" or "0" required by the logic circuit. However, the magnetic field obtained by the current requires a large current density, which is high in energy consumption, and limits the arrangement density of the memory cell array, that is, the magnetic junction array.

One type of MRAM is a magnetic random access memory based on spin transfer torque (STT-MRAM). Using the action of the spin-polarized current (spin torque) on the magnetization, the purpose of changing the magnetization direction of the free magnetic layer is achieved; and the magnetization direction of the free magnetic layer is switched by changing the direction of the current, thereby completing the data writing of the MJ in the STT-MRAM. However, the spin-polarized current applied to the STT-MRAM is generally about $10^7$ A/cm$^2$, so the larger spin-polarized current limits the arrangement density of the memory cell array while consuming more power and the generated Joule heat also has a tremendous destructive effect on device stability. In order to solve this problem, the present invention proposes an electric field-assisted controlled magnetic random access memory based on a synthetic antiferromagnetic free layer, that is, an electric field is used to control a synthetic antiferromagnetic layer to transform from an antiferromagnetic state to a ferromagnetic state, with this feature, using the synthetic antiferromagnetic layer as a free magnetic layer of the magnetic tunnel junction, the writing spin-polarized current can be reduced, thus the arrangement density of the storage unit array can be improved and the energy consumption is saved. Moreover, with the TMR between the ferromagnetic layer close to the barrier layer and the pinned layer, the data writing is achieved.

SUMMARY OF THE PRESENT INVENTION

An object of the present invention is to provide an STT-MRAM (spin transfer torque-magnetic random access memory). A paper, titled as "Low voltage switching of magnetism through ionic liquid gating control of RKKY interaction in FeCoB/Ru/FeCoB and (Pt/Co)$_2$/Ru/(Co/Pt)$_2$ multilayers", is published on *Nature Communication*. This paper reports that an SAF (synthetic antiferromagnetic) multilayer structure is controlled by an electric field to transform from an antiferromagnetic state to a ferromagnetic state. Based on U.S. Pat. No. 8,406,042 B2, Jianxin Zhu, proposed for stress-assisted free magnetic layer switching, and U.S. Pat. No. 8,211,557 B2, Jiangang Zhu, proposed for heat-assisted free magnetic layer switching, the present invention provides an STT-MRAM, which combines the synthetic antiferromagnetic device with a conventional magnetic tunnel junction, uses the SAF device as a free magnetic layer of the magnetic tunnel junction, so that the SAF device transforms from an antiferromagnetic state to a ferromagnetic state under an action of an electric field, and simultaneously, a current is applied to directly regulate the switch direction of the free magnetic layer of the magnetic tunnel junction; and at this time, the current is smaller than a current when a free magnetic layer of a conventional magnetic tunnel junction is switched. Therefore, the STT-MRAM is called as the electric field assisted magnetic random access memory based on the synthetic antiferromagnetic free magnetic layer, which writes in the data under a coaction of the electric field and the current. Moreover, the electric field assists in controlling the transformation between the antiferromagnetic state and the ferromagnetic state. Therefore, the STT-MRAM has fast speed and low power consumption.

The present invention is achieved through technical solutions as follows.

A synthetic antiferromagnetic device, having a stacked structure, comprises a first ferromagnetic layer, a second ferromagnetic layer and a nonmagnetic spacing layer sandwiched between the first ferromagnetic layer and the second ferromagnetic layer, wherein:

when the synthetic antiferromagnetic device is in an antiferromagnetic state, after being applied an electric field with an intensity in a range of 0.1 V to 15 V, the synthetic antiferromagnetic device transforms from the antiferromagnetic state to a ferromagnetic state; after removing the electric field, the synthetic antiferromagnetic device transforms from the ferromagnetic state back to the antiferromagnetic state, so as to achieve transformation between the antiferromagnetic state and the ferromagnetic state through regulating the electric field.

Preferably, both the first ferromagnetic layer and the second ferromagnetic layer are made from but not limited to [Co/Pt]$_n$ multilayer or FeCoB; the nonmagnetic spacing layer is made from but not limited to Ru and a thickness of the nonmagnetic spacing layer is in a range of 0.1 nm to 10 nm.

Preferably, a magnetization direction of both the first ferromagnetic layer and the second ferromagnetic layer is perpendicular to interface.

Preferably, a magnetization direction of both the first ferromagnetic layer and the second ferromagnetic layer is parallel to interface.

Also, the present invention provides a magnetic tunnel junction device based on the synthetic antiferromagnetic free magnetic layer, wherein the magnetic tunnel junction comprises a pinned magnetic layer, a free magnetic layer embodied as a synthetic antiferromagnetic device, and a nonmagnetic barrier layer sandwiched between the pinned magnetic layer and the free magnetic layer; a magnetization direction of both the pinned magnetic layer and the free magnetic layer is perpendicular or parallel to the interface;

the free magnetic layer embodied as the synthetic antiferromagnetic device has a stacked structure and comprises a first ferromagnetic layer, a second ferromagnetic layer and a nonmagnetic spacing layer sandwiched between the first ferromagnetic layer and the second ferromagnetic layer;

the magnetic tunnel junction device further comprises a first electrode and a second electrode which are respectively in contact with the pinned magnetic layer and the first ferromagnetic layer of the free magnetic layer, so as to enable a current to conduct in the magnetic tunnel junction device.

Preferably, the free magnetic layer is made from but not limited to Fe, Co, CoFe, Ni, CoCrPt, CoFeB, (Co/Ni)$_p$, (Co/Pd)$_m$ or (Co/Pt)$_n$, wherein m, n and p refer to a repeat time of stacked multi-layer; the nonmagnetic spacing layer of the free magnetic layer is made from but not limited to at least one member selected from a group consisting of Nb, Ta, Cr, Mo, W, Re, Ru, Os, Rh, Ir, Pt, Cu, Ag and Au.

Preferably, the pinned magnetic layer is made from a ferromagnetic metal, a ferrimagnetic metal, a ferromagnetic metal alloy or a ferrimagnetic metal alloy; and is made from but not limited to Fe, Co, Ni, Mn, NiFe, FePd, FePt, CoFe, CoPd, CoPt, YCo, LaCo, PrCo, NdCo, SmCo, CoFeB, BiMn or NiMnSb, or a composite material of one of Fe, Co, Ni, Mn, NiFe, FePd, FePt, CoFe, CoPd, CoPt, YCo, LaCo, PrCo, NdCo, SmCo, CoFeB, BiMn and NiMnSb, and at least one of B, Al, Zr, Hf, Nb, Ta, Cr, Mo, Pd and Pt.

Preferably, the pinned magnetic layer is made from synthetic ferromagnetic or ferrimagnetic material; and is a synthetic multilayer structure which is made from but not limited to Co/Ir, Co/Pt, Co/Pd, CoCr/Pt, Co/Au or Ni/Co and stacked by 3d/4d/4f/5d/5f/rare earth metal layer.

Preferably, the pinned magnetic layer is made from a semi-metallic ferromagnetic material which comprise Heusler alloy in a form of XYZ or X$_2$YZ, wherein X is but not limited to at least one member selected from a group consisting of Mn, Fe, Co, Ni, Pd and Cu; Y is but not limited to at least one member selected from a group consisting of Ti, V, Cr, Mn, Fe, Co and Ni; Z is but not limited to at least one member selected from a group consisting of Al, Ga, In, Si, Ge, Sn and Sb.

Preferably, the pinned magnetic layer is made from a synthetic antiferromagnetic (SAF) material and comprises two ferromagnetic layers and a spacing layer; every ferromagnetic layer of the pinned magnetic layer is made from but not limited to Fe, Co, CoFe, Ni, CoCrPt, CoFeB, (Co/Ni)$_p$, (Co/Pd)$_m$ or (Co/Pt)$_n$, wherein m, n and p refer to a repeat time of stacked multi-layer; the spacing layer of the pinned magnetic layer is made from but not limited to at least one member selected from a group consisting of Nb, Ta, Cr, Mo, W, Re, Ru, Os, Rh, Ir, Pt, Cu, Ag and Au.

Preferably, the nonmagnetic barrier layer is made from an oxide, nitride, or oxynitride material, wherein a composite element of the oxide, nitride, or oxynitride material is but not limited to at least one member selected from a group consisting of Mg, B, Al, Ca, Sr, La, Ti, Hf, V, Ta, Cr, W, Ru, Cu, In, Si and Eu.

Preferably, the nonmagnetic barrier layer is made from a metal or alloy, wherein a composite element of the metal or alloy is but not limited to at least one member selected from a group consisting of Cu, Ag, Au, Al, Pt, Ta, Ti, Nb, Os, Ru, Rh, Y, Mg, Pd, Cr, W, Mo and V.

Preferably, the nonmagnetic barrier layer is made from but not limited to SiC, C or a ceramic material.

Preferably, every electrode is made from but not limited to at least one member selected from a group consisting of Li, Mg, Al, Ca, Sc, Ti, V, Mn, Cu, Zn, Ga, Ge, Sr, Y, Zr, Nb, Mo, Tc, Ru, Rh, Pd, Ag, Cd, In, Sn, Sb, Ba, Hf, Ta, W, Re, Os, Ir, Pt, Au, Tl, Pb, Bi, Po, La, Ce, Pr, Nd, Pm, Sm, Eu, Gd, Tb, Dy, Ho, Er, Tm and Yb.

Preferably, every electrode is made from a carbon-based conductive material which is but not limited to graphite, carbon nanotube or bamboo charcoal.

Also, the present invention provides a magnetic random access memory based on a synthetic antiferromagnetic free magnetic layer, which comprises a magnetic tunnel junction device auxiliary controlled by an electric field, wherein the magnetic tunnel junction device comprises a pinned magnetic layer, a free magnetic layer embodied as a synthetic antiferromagnetic device, and a nonmagnetic barrier layer sandwiched between the pinned magnetic layer and the free magnetic layer; a magnetization direction of both the pinned magnetic layer and the free magnetic layer is perpendicular or parallel to interface, the synthetic antiferromagnetic device transforms between an antiferromagnetic state and a ferromagnetic state through the electric field;

the magnetic random access memory further comprises two parallel electrode plates for generating the electric field which are respectively located at two ends of the magnetic tunnel junction device, and are respectively separated from the two ends of the magnetic tunnel junction device through two insulation layers; the two parallel electrode plates generates the electric field through an externally connected power supply.

Beneficially effects of the present invention are as follows.

The synthetic antiferromagnetic device is used as the free magnetic layer of the magnetic tunnel junction to form a magnetic random access memory. The magnetic random access memory, having a stacked structure, comprises the synthetic antiferromagnetic device, a pinned magnetic layer and a nonmagnetic barrier layer sandwiched therebetween; under the regulation of the electric field, the free magnetic layer embodied as the synthetic antiferromagnetic device transforms between the antiferromagnetic state and the ferromagnetic state; the magnetization direction of the free magnetic layer is directly regulated by the current; the ferromagnetic layer close to the nonmagnetic barrier layer of the magnetic tunnel junction thus switched with electric field assistant to write data, thereby reducing the switch current of the free magnetic layer.

Characteristics of the present invention are as follows:

(1) The switch current of the free magnetic layer is decreased to reduce device heating, device power consumption and device size, and improve the arrangement intensity performance of the memory cell array.

(2) In the present invention, the synthetic antiferromagnetic device is used as the free magnetic layer of the magnetic tunnel junction to strength the anti-interference ability, so as to further explore the application space of spintronic devices and promote the development of new memory industry.

BRIEF DESCRIPTION OF THE DRAWINGS

The drawings described herein are provided to further understand the present invention, form a part of the present application, and are not intended to be a limitation of the present invention. In the drawings.

DETAILED DESCRIPTION OF THE PREFERRED EMBODIMENT

The technical solution of the present invention is described in detail with accompanying drawings and embodiments as follows, the following embodiments relate to a magnetic random access memory which is capable of controlling a synthetic antiferromagnetic device to transform from an antiferromagnetic state to a ferromagnetic state by an electric field, but do not constitute a basis for any limitation of the present invention.

Figure 1A:
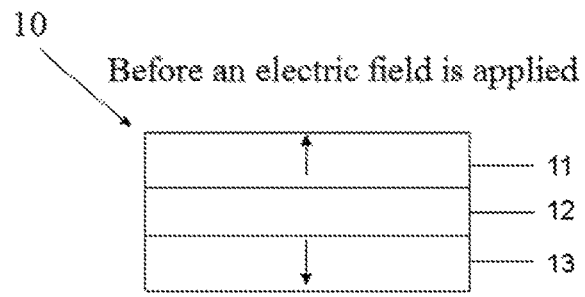
FIGS. 1(a)-(d) show a synthetic antiferromagnetic device which is able to be regulated by an electric field according to a first preferred embodiment of the present invention.
Figure 1C:
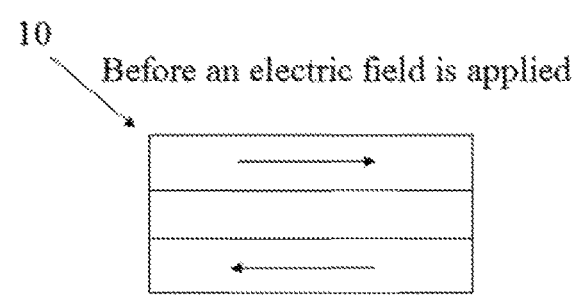
Figure 1B:
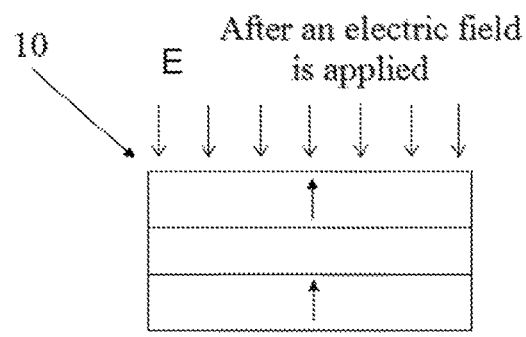
Figure 1D:
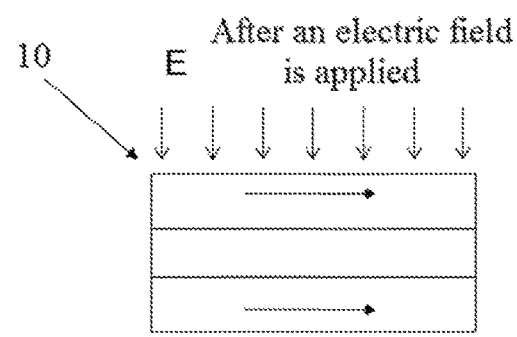

FIGS. 1(a)-(d) show a synthetic antiferromagnetic device 10 which is able to be regulated by an electric field according to a first preferred embodiment of the present invention. FIGS. 1(a)-(d) and any other drawings of the present invention are not drawn to scale. FIGS. 1(a)-(b) show a synthetic antiferromagnetic device with a magnetization direction approximately perpendicular to the interface, FIGS. 1(c)-(d) show a synthetic antiferromagnetic device with a magnetization direction approximately parallel to the interface. As shown in FIGS. 1(a)-(d), the synthetic antiferromagnetic device 10 comprises a first ferromagnetic layer 11, a second ferromagnetic layer 13 and a nonmagnetic spacing layer 12 sandwiched between the first ferromagnetic layer 11 and the second ferromagnetic layer 13, wherein the first ferromagnetic layer 11 is made from CoPt, FeCoB or other ferromagnetic materials, the second ferromagnetic layer 13 is made from CoPt, FeCoB or other ferromagnetic materials, the nonmagnetic spacing layer 12 is made from Ru. Referring to FIGS. 1(a) and (c), the synthetic antiferromagnetic device 10 is in an antiferromagnetic state before an electric field is applied; referring to FIGS. 1(b) and (d), after the electric field is applied, the synthetic antiferromagnetic device 10 transforms from the antiferromagnetic state to a ferromagnetic state; the electric field in the drawings is generated by another device which is shown later, and the electric field is temporarily represented by a symbol E. A thickness of the nonmagnetic spacing layer 12 is in a range of 0.1 nm to 10 nm, an intensity of the electric field is in a range of 0.1 V to 15.0 V.

Figure 2:
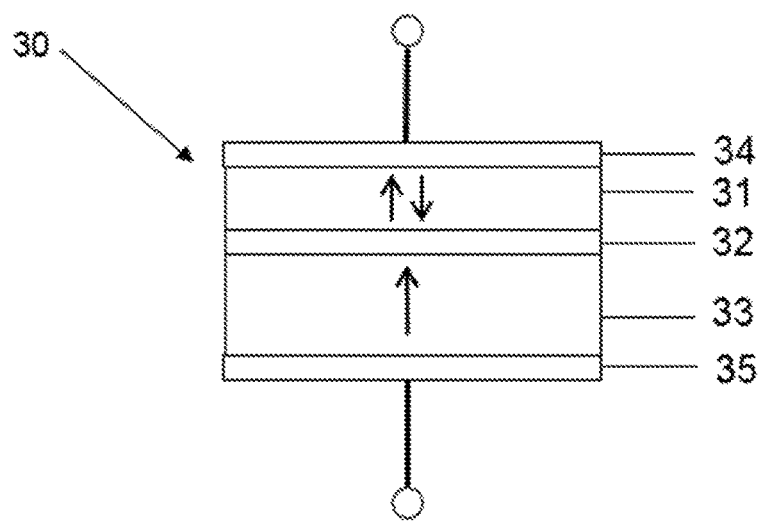
FIG. 2 is a structurally schematic view of a magnetic tunnel junction with a magnetization direction approximately perpendicular to interface according to a second preferred embodiment of the present invention.

FIG. 2 is a structurally schematic view of a magnetic tunnel junction with a magnetization direction approximately perpendicular to the interface (also the magnetization direction is able to be approximately parallel to the interface, which is not repeated here) according to a second preferred embodiment of the present invention. The magnetic tunnel junction 30 comprises a free magnetic layer 31, a pinned magnetic layer 33 and a nonmagnetic barrier layer 32 sandwiched between the free magnetic layer 31 and the pinned magnetic layer 33. A magnetization direction of the free magnetic layer 31 is more likely to be switched than a magnetization direction of the pinned magnetic layer 33, that is, under an action of spin torque, the magnetization direction of the free magnetic layer 31 is able to be switched, and the magnetization direction of the pinned magnetic layer 33 remains unchanged. A resistance of the magnetic tunnel junction is determined by a relative magnetization direction of the free magnetic layer 31 and the pinned magnetic layer 33. When the magnetization direction of the free magnetic layer 31 is parallel to the magnetization direction of the pinned magnetic layer 33, the magnetic tunnel junction 30 is in a low-resistance state; when the magnetization direction of the free magnetic layer 31 is antiparallel to the magnetization direction of the pinned magnetic layer 33, the magnetic tunnel junction 30 is in a high-resistance state. The nonmagnetic barrier layer 32 is made from an insulation material, such as a metal oxide $Al_2O_3$, $TiO_x$ and MgO. Both the free magnetic layer 31 and the pinned magnetic layer 33 are made from a ferromagnetic material, such as Fe, Co, Ni, NiFe, CoFe, and CoFeB. Each of the free magnetic layer 31 and the pinned magnetic layer 33 is able to be not only a single-layer ferromagnetic structure, but also a synthetic antiferromagnetic (SAF) coupling structure. For example, two ferromagnetic sublayers are separated by a metal spacing layer to form the synthetic antiferromagnetic structure, wherein magnetization directions of the two ferromagnetic sublayers are opposite to each other for providing a net magnetization; the metal spacing layer is made from Ru or Cu.

As shown in FIG. 2, a first electrode 35 is in contact with the pinned magnetic layer 33, a second electrode 34 is in contact with the free magnetic layer 31, and the first electrode 35 and the second electrode 34 are connected with a control circuit to provide a read current or a write current for the magnetic tunnel junction. When the read current or the write current passes through the magnetic tunnel junction from the pinned magnetic layer to the free magnetic layer, a spin-polarized current is formed for generating a spin torque to act on the free magnetic layer; when the spin torque is large enough, the magnetization direction of the free magnetic layer is switched, so that the magnetization direction of the free magnetic layer is parallel to the magnetization direction of the pinned magnetic layer, namely, the magnetic tunnel junction is in the low-resistance state; when the read current or the write current enters into the magnetic tunnel junction from the free magnetic layer to the pinned magnetic layer, the magnetization direction of the free magnetic layer is antiparallel to the magnetization direction of the pinned magnetic layer, namely, the magnetic tunnel junction is in the high-resistance state.

Figure 3:
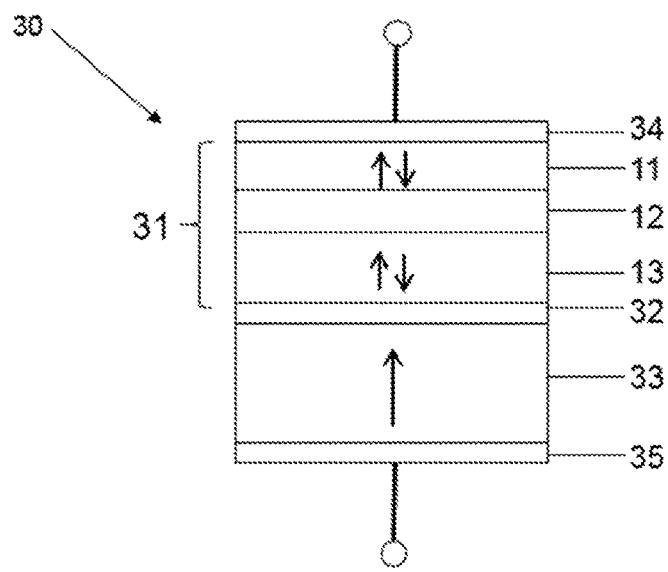
FIG. 3 is a structurally schematic view of a magnetic tunnel junction with perpendicular magnetic anisotropy according to a third preferred embodiment of the present invention, wherein the magnetic tunnel junction comprises a free magnetic layer based on the synthetic antiferromagnetic device.

As shown in FIG. 3, a magnetic tunnel junction 30 according to a third preferred embodiment of the present invention is illustrate, wherein the magnetic tunnel junction 30 comprises a free magnetic layer 31, a pinned magnetic layer 33 and a nonmagnetic barrier layer 32 sandwiched between the free magnetic layer 31 and the pinned magnetic layer 33, wherein a magnetization direction of both the free magnetic layer 31 and the pinned magnetic layer 33 is approximately perpendicular to the interface. Different from the magnetic tunnel junction 30 shown in FIG. 2, the free magnetic layer 31 of the magnetic tunnel junction 30 is embodied as the synthetic antiferromagnetic device 10 shown in FIG. 1.

According to the third preferred embodiment of the present invention, the free magnetic layer 31, made from a synthetic antiferromagnetic (SAF) material, comprises two ferromagnetic layers and a spacing layer; every ferromagnetic layer is made from but not limited to Fe, Co, CoFe, Ni, CoCrPt, CoFeB, $(Co/Ni)_p$, $(Co/Pd)_m$ or $(Co/Pt)_n$, wherein m, n and p refer to a repeat time of stacked multi-layer; the spacing layer is made from but not limited to at least one member selected from a group consisting of Nb, Ta, Cr, Mo, W, Re, Ru, Os, Rh, Ir, Pt, Cu, Ag and Au.

According to the third preferred embodiment of the present invention, the pinned magnetic layer 33 is made from a ferromagnetic metal, a ferrimagnetic metal, a ferromagnetic metal alloy or a ferrimagnetic metal alloy; and is made from but not limited to Fe, Co, Ni, Mn, NiFe, FePd, FePt, CoFe, CoPd, CoPt, YCo, LaCo, PrCo, NdCo, SmCo, CoFeB, BiMn or NiMnSb, or a composite material of one of Fe, Co, Ni, Mn, NiFe, FePd, FePt, CoFe, CoPd, CoPt, YCo, LaCo, PrCo, NdCo, SmCo, CoFeB, BiMn and NiMnSb, and at least one of B, Al, Zr, Hf, Nb, Ta, Cr, Mo, Pd and Pt.

In other embodiments, the pinned magnetic layer 33 is made from a semi-metallic ferromagnetic material which comprises a Heusler alloy in a form of XYZ or $X_2YZ$, wherein X is but not limited to at least one member selected from a group consisting of Mn, Fe, Co, Ni, Pd and Cu; Y is but not limited to at least one member selected from a group consisting of Ti, V, Cr, Mn, Fe, Co and Ni; Z is but not limited to at least one member selected from a group consisting of Al, Ga, In, Si, Ge, Sn and Sb.

In other embodiments, the pinned magnetic layer 33, made from a synthetic antiferromagnetic (SAF) material, comprises two ferromagnetic layers and a spacing layer; every ferromagnetic layer of the pinned magnetic layer is made from but not limited to Fe, Co, CoFe, Ni, CoCrPt, CoFeB, $(Co/Ni)_p$, $(Co/Pd)_m$ or $(Co/Pt)_n$, wherein m, n and p refer to a repeat time of stacked multi-layer; the spacing layer of the pinned magnetic layer is made from but not limited to at least one member selected from a group consisting of Nb, Ta, Cr, Mo, W, Re, Ru, Os, Rh, Ir, Pt, Cu, Ag and Au.

According to the third preferred embodiment of the present invention, both the free magnetic layer 31 and the pinned magnetic layer 33 are electrically conductive.

In some embodiments, the nonmagnetic barrier layer 32 is an insulated tunnel barrier layer and is made from an oxide, nitride, or oxynitride material, wherein a component element of the oxide, nitride, or oxynitride material is but not limited to at least one member selected from a group consisting of Mg, B, Al, Ca, Sr, La, Ti, Hf, V, Ta, Cr, W, Ru, Cu, In, Si and Eu.

In other embodiments, the nonmagnetic barrier layer 32 is a conductive layer which is made from but not limited to at least one member selected from a group consisting of Cu, Ag, Au, Al, Pt, Ta, Ti, Nb, Os, Ru, Rh, Y, Mg, Pd, Cr, W, Mo and V.

In other embodiments, the nonmagnetic barrier layer 32 is made from but not limited to SiC, C or a ceramic material.

In other embodiments, the nonmagnetic barrier layer 32 is able to be other structures. For example, U.S. Pat. No. 9,076,537, titled as "Method and system for providing a magnetic tunneling junction using spin-orbit interaction based switching and memories utilizing the magnetic tunneling junction", proposed adding a granular layer including conductive channels in an insulating matrix.

In the third preferred embodiment of the present invention, the free magnetic layer 31 and the pinned magnetic layer 33, both of which are made from different materials, are ferromagnetic; the insulated tunnel barrier layer 32 is nonmagnetic.

As shown in FIG. 3, a first electrode 35 is in contact with the pinned magnetic layer 33, a second electrode 34 is in contact with the free magnetic layer 31, the first electrode 35 and the second electrode 34 are connected with a control circuit to provide a read current or a write current for the magnetic tunnel junction, and simultaneously, through the first electrode 35 and the second electrode 34, the magnetic tunnel junction 30 is connected with the control circuit. Both the first electrode 35 and the second electrode 34 are made from a conductive material which is but not limited to at least one member selected from a group consisting of Li, Mg, Al, Ca, Sc, Ti, V, Mn, Cu, Zn, Ga, Ge, Sr, Y, Zr, Nb, Mo, Tc, Ru, Rh, Pd, Ag, Cd, In, Sn, Sb, Ba, Hf, Ta, W, Re, Os, Ir, Pt, Au, Tl, Pb, Bi, Po, La, Ce, Pr, Nd, Pm, Sm, Eu, Gd, Tb, Dy, Ho, Er, Tm and Yb. In other embodiments, the conductive material is a carbon-based conductive material which is but not limited to graphite, carbon nanotube or bamboo charcoal.

Figure 4A:
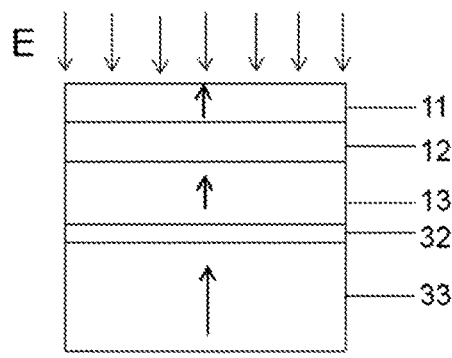
FIG. 4(a) is a structurally schematic view of a magnetic tunnel junction which adopts a synthetic antiferromagnetic device as a free magnetic layer under an action of an electric field.
Figure 4C:
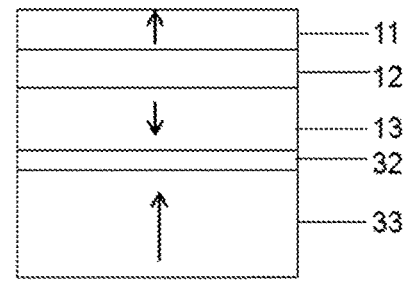
FIG. 4(c) shows that after removing the electric field, the free magnetic layer embodied as the synthetic antiferromagnetic device transforms from the ferromagnetic state to the antiferromagnetic state.
Figure 4B:
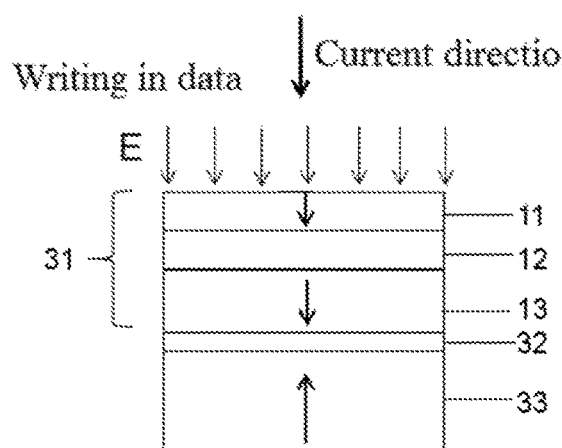
FIG. 4(b) shows that under a coaction of both a first direction current and an electric field, the free magnetic layer based on the synthetic antiferromagnetic device is switched to achieve data writing.
Figure 4D:
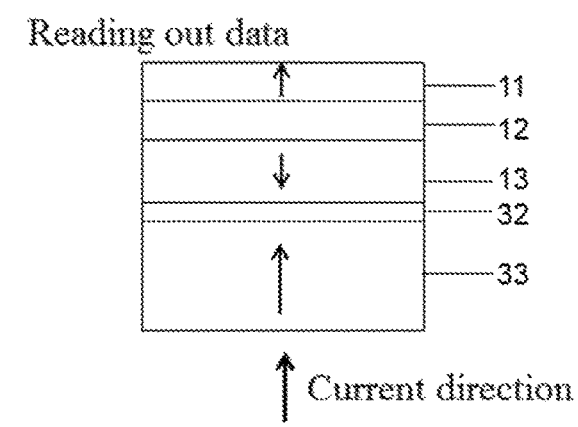
FIG. 4(d) shows that through a small current in one direction, data of the magnetic tunnel junction are read out in the absence of an electric field.

FIG. 4(a) is a structurally schematic view of the magnetic tunnel junction which adopts the synthetic antiferromagnetic device 10 as the free magnetic layer 31 under the action of an electric field. After being applied an electric field, the synthetic antiferromagnetic device 10 transforms from the antiferromagnetic state to the ferromagnetic state, that is, the magnetization direction of the free magnetic layer 31 is switched. FIG. 4(b) shows that under the coaction of both a first direction current and an electric field, the free magnetic layer 31 embodied as the synthetic antiferromagnetic device is switched to achieve data writing; when the current I passes through the magnetic tunnel junction via the electrodes from the free magnetic layer 31 to the pinned magnetic layer 33, the magnetization direction of the ferromagnetic layer 13 of the free magnetic layer 31 is opposite to the magnetization direction of the pinned magnetic layer 33, so that a binary state "0" is written into the magnetic tunnel junction. FIG. 4(c) shows that after removing the electric field, the free magnetic layer 31 embodied as the synthetic antiferromagnetic device transforms from the ferromagnetic state to the antiferromagnetic state, the magnetization direction of the ferromagnetic layer 13 remains unchanged due to the pinning effect thereof, and the magnetization direction of the ferromagnetic layer 11 is changed. FIG. 4(d) shows that through a small current in one direction, data of the magnetic tunnel junction comprising the free magnetic layer 31 which is embodied as the synthetic antiferromagnetic device are read out in the absence of an electric field; and at this time, tunneling magnetoresistance (TMR) between the ferromagnetic layer 13 and the pinned magnetic layer 33 of the magnetic tunnel junction plays a dominant role, the magnetization direction of the ferromagnetic layer 13 is opposite to the magnetization direction of the pinned magnetic layer 33, so that the binary state "0" is read out.

Figure 5A:
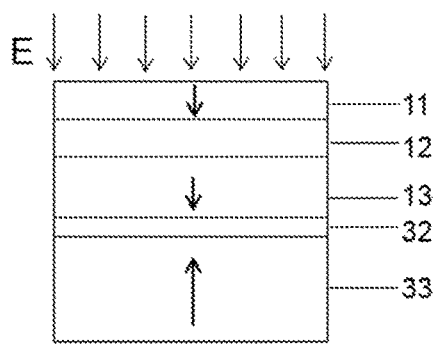
FIG. 5(a) is a structurally schematic view of a magnetic tunnel junction which adopts a synthetic antiferromagnetic device as a free magnetic layer under an action of an electric field.
Figure 5C:
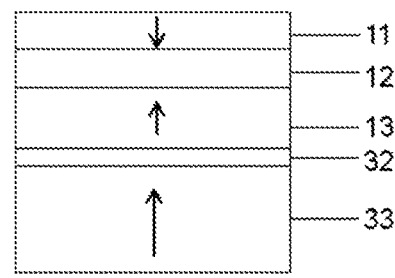
FIG. 5(c) shows that after removing the electric field, the free magnetic layer embodied as the synthetic antiferromagnetic device transforms from the ferromagnetic state to the antiferromagnetic state.
Figure 5B:
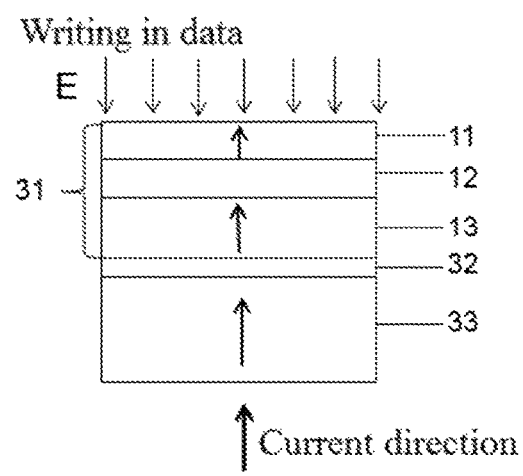
FIG. 5(b) shows that under a coaction of both a second direction current and an electric field, the free magnetic layer based on the synthetic antiferromagnetic device is switched to achieve data writing.
Figure 5D:
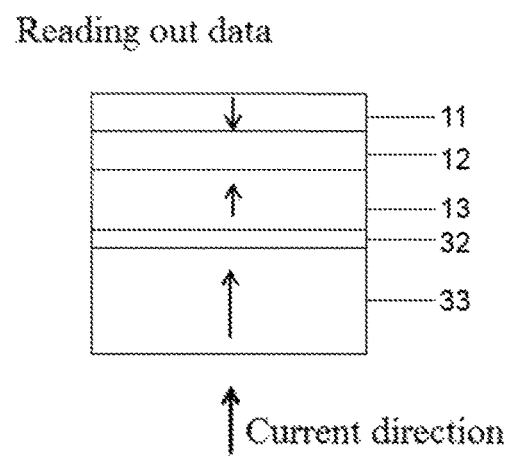
FIG. 5(d) shows that through a small current in one direction, data of the magnetic tunnel junction are read out in the absence of an electric field.

FIG. 5(a) is a structurally schematic view of the magnetic tunnel junction which adopts the synthetic antiferromagnetic device 10 as the free magnetic layer 31 under the action of an electric field. After being applied an electric field, the synthetic antiferromagnetic device 10 transforms switches from the antiferromagnetic state to the ferromagnetic state, that is, the magnetization direction of the free magnetic layer 31 is switched. FIG. 5(b) shows that under the coaction of both a second direction current and an electric field, the free magnetic layer 31 embodied as the synthetic antiferromagnetic device is switched to achieve data writing; when the current I passes through the magnetic tunnel junction via the electrodes from the pinned magnetic layer 33 to the free magnetic layer 31, the magnetization direction of the ferromagnetic layer 13 of the free magnetic layer 31 is as same as the magnetization direction of the pinned magnetic layer 33, so that a binary state "1" is written into the magnetic tunnel junction. FIG. 5(c) shows that after removing the electric field, the free magnetic layer 31 embodied as the synthetic antiferromagnetic device transforms from the ferromagnetic state to the antiferromagnetic state, the magnetization direction of the ferromagnetic layer 13 remains unchanged due to the pinning effect thereof, and the magnetization direction of the ferromagnetic layer 11 is changed. FIG. 5(d) shows that through a small current in one direction, data of the magnetic tunnel junction comprising the free magnetic layer 31 which is embodied as the synthetic antiferromagnetic device are read out in the absence of an electric field; and at this time, TMR between the ferromagnetic layer 13 and the pinned magnetic layer 33 of the magnetic tunnel junction plays a dominant role, the magnetization direction of the ferromagnetic layer 13 is as same as the magnetization direction of the pinned magnetic layer 33, so that the binary state "1" is read out.

Figure 6:
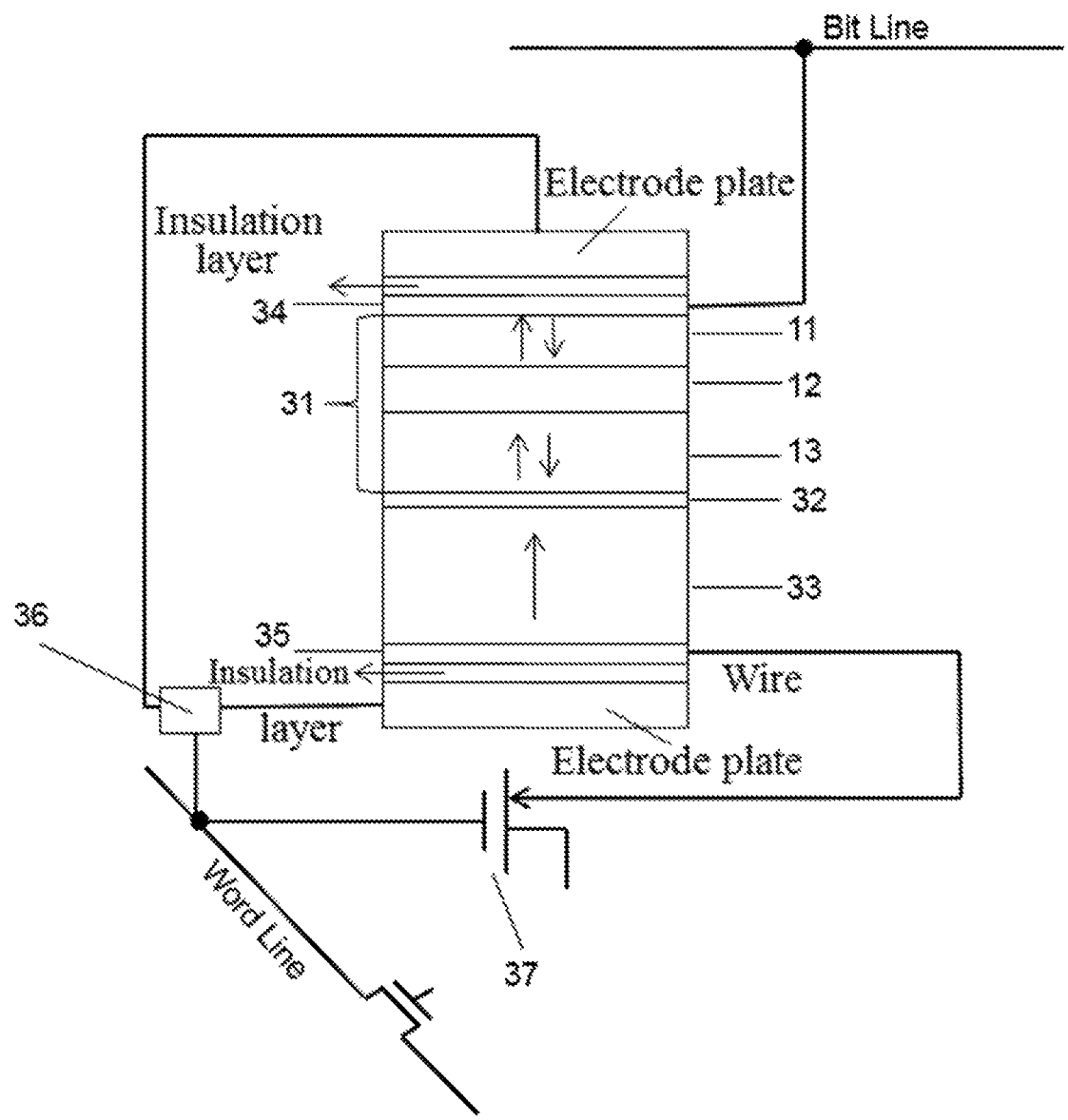
FIG. 6 is a structurally schematic view of an electric field assisted magnetic random access memory based on the synthetic antiferromagnetic free magnetic layer, the magnetic random access memory according to a fourth preferred embodiment of the present invention.

FIG. 6 is a structurally schematic view of a magnetic random access memory according to a fourth preferred embodiment of the present invention is illustrated, which comprises a magnetic tunnel junction 30, electrodes 34, 35 and a pair of parallel electrode plates, wherein the magnetic tunnel junction, auxiliary controlled by an electric field, comprises a pinned magnetic layer 33, a free magnetic layer 31 embodied as a synthetic antiferromagnetic device, and a nonmagnetic barrier layer 32 sandwiched between the pinned magnetic layer 33 and the free magnetic layer 31; a magnetization direction of both the pinned magnetic layer 33 and the free magnetic layer 31 is perpendicular to the interface or is parallel to the interface, the synthetic antiferromagnetic device transforms between an antiferromagnetic state and a ferromagnetic state through an electric field.

The two parallel electrode plates of the magnetic random access memory for generating the electric field are respectively located at two ends of the magnetic tunnel junction, and are respectively separated from the two ends of the magnetic tunnel junction through two insulation layers, the two parallel electrode plates generate the electric field through an externally connected power supply, and the synthetic antiferromagnetic device transforms from the antiferromagnetic state to the ferromagnetic state under the action of the electric field.

In the magnetic random access memory, the switch of the free magnetic layer 31 embodied as the synthetic antiferromagnetic device is controlled by the electric field. The two parallel electrode plates are connected with an external circuit voltage controller 36. The magnetic tunnel junction 30 comprises a pinned magnetic layer 33, a free magnetic layer 31 embodied as the synthetic antiferromagnetic device, and a nonmagnetic barrier layer 32 sandwiched between the pinned magnetic layer 33 and the free magnetic layer 31; the magnetic tunnel junction 30 is connected with a bit line through a second electrode 34, and is connected with a word line and a transistor 37 through a first electrode 35. When a current passes through the magnetic tunnel junction, the voltage controller 36 is able to quickly provide a voltage for the two parallel electrode plates to generate an electric field, so that the electric field and the current simultaneously control the switch of the free magnetic layer 31 embodied as the synthetic antiferromagnetic device, so as to reduce the write current, thereby reducing power consumption.

The present invention is not limited to the above embodiments, and based on the technical solutions disclosed by the present invention, those skilled in the art can make some substitutions and deformations on some of these technical features according to the disclosed technical content without any creative labor, and these substitutions and deformations are within the protective scope of the present invention.

What is claimed is:

1. A magnetic random access memory comprising a magnetic tunnel junction device and two parallel electrode plates, wherein:
    the magnetic tunnel junction device comprises:
        a pinned magnetic layer;
        a free magnetic layer embodied as a synthetic antiferromagnetic device, which comprises a first ferromagnetic layer, a second ferromagnetic layer and a nonmagnetic spacing layer sandwiched between the first ferromagnetic layer and the second ferromagnetic layer, wherein: a magnetization direction of both the pinned magnetic layer and the free magnetic layer is perpendicular or parallel to a wafer surface;
        a nonmagnetic barrier layer sandwiched between the pinned magnetic layer and the free magnetic layer; and
        a first electrode and a second electrode which are respectively in contact with the pinned magnetic layer and the first ferromagnetic layer of the free magnetic layer for producing a current;
    the two parallel electrode plates for generating an electric field are respectively located at two ends of the magnetic tunnel junction device, and respectively separated from the two ends of the magnetic tunnel junction device through two insulation layers, in such a manner that an antiferromagnetic state and a ferromagnetic state of the synthetic antiferromagnetic device transform each other under an action of the electric field, so that a magnetization direction of the free magnetic layer is regulated by combining the current with the electric field.

2. The magnetic random access memory, as recited in claim 1, wherein: the first ferromagnetic layer and the second ferromagnetic layer of the free magnetic layer are made from Fe, Co, CoFe, Ni, CoCrPt, CoFeB, $(Co/Ni)_p$, $(Co/Pd)_m$ or $(Co/Pt)_n$, wherein m, n and p refer to a repeat time of stacked multi-layer; the nonmagnetic spacing layer of the free magnetic layer is made from at least one member selected from a group consisting of Nb, Ta, Cr, Mo, W, Re, Ru, Os, Rh, Ir, Pt, Cu, Ag and Au.

3. The magnetic random access memory, as recited in claim 1, wherein: the pinned magnetic layer is made from Fe, Co, Ni, Mn, NiFe, FePd, FePt, CoFe, CoPd, CoPt, YCo, LaCo, PrCo, NdCo, SmCo, CoFeB, BiMn or NiMnSb, or a composite material of one of Fe, Co, Ni, Mn, NiFe, FePd, FePt, CoFe, CoPd, CoPt, YCo, LaCo, PrCo, NdCo, SmCo, CoFeB, BiMn and NiMnSb, and at least one of B, Al, Zr, Hf, Nb, Ta, Cr, Mo, Pd and Pt;
    or the pinned magnetic layer is a synthetic multilayer structure which is made from Co/Ir, Co/Pt, Co/Pd, CoCr/Pt, Co/Au or Ni/Co multilayer and stacked by 3d/4d/4f/5d/5f/rare earth metal layer;
    or the pinned magnetic layer is made from a Heusler alloy in a form of XYZ or $X_2YZ$, wherein X is at least one member selected from a group consisting of Mn, Fe, Co, Ni, Pd and Cu; Y is at least one member selected from a group consisting of Ti, V, Cr, Mn, Fe, Co and Ni; Z is at least one member selected from a group consisting of Al, Ga, In, Si, Ge, Sn and Sb;
    or the pinned magnetic layer is made from a synthetic antiferromagnetic material and comprises two ferromagnetic layers and a spacing layer; every ferromagnetic layer of the pinned magnetic layer is made from Fe, Co, CoFe, Ni, CoCrPt, CoFeB, $(Co/Ni)_p$, $(Co/Pd)_m$ or $(Co/Pt)_n$, wherein m, n and p refer to a repeat time of stacked multi-layer; the spacing layer of the pinned magnetic layer is made from at least one member selected from a group consisting of Nb, Ta, Cr, Mo, W, Re, Ru, Os, Rh, Ir, Pt, Cu, Ag and Au.

4. The magnetic random access memory, as recited in claim 1, wherein: the nonmagnetic barrier layer is made from an oxide, nitride, or oxynitride material, wherein a component element of the oxide, nitride, or oxynitride material is at least one member selected from a group consisting of Mg, B, Al, Ca, Sr, La, Ti, Hf, V, Ta, Cr, W, Ru, Cu, In, Si and Eu;
    or the nonmagnetic barrier layer is made from at least one member selected from a group consisting of Cu, Ag, Au, Al, Pt, Ta, Ti, Nb, Os, Ru, Rh, Y, Mg, Pd, Cr, W, Mo and V;
    or the nonmagnetic barrier layer is made from SiC, C or a ceramic material.

5. The magnetic random access memory, as recited in claim 1, wherein: every electrode is made from at least one member selected from a group consisting of Li, Mg, Al, Ca, Sc, Ti, V, Mn, Cu, Zn, Ga, Ge, Sr, Y, Zr, Nb, Mo, Tc, Ru, Rh, Pd, Ag, Cd, In, Sn, Sb, Ba, Hf, Ta, W, Re, Os, Ir, Pt, Au, Tl, Pb, Bi, Po, La, Ce, Pr, Nd, Pm, Sm, Eu, Gd, Tb, Dy, Ho, Er, Tm and Yb;
    or every electrode is made from graphite, carbon nanotube or bamboo charcoal.

6. The magnetic random access memory, as recited in claim 1, wherein: both the first ferromagnetic layer and the second ferromagnetic layer are made from $[Co/Pt]_n$ multilayer or FeCoB; the nonmagnetic spacing layer is made from Ru and a thickness of the nonmagnetic spacing layer is in a range of 0.1 nm to 10 nm.

7. The magnetic random access memory, as recited in claim 1, wherein: a magnetization direction of both the first ferromagnetic layer and the second ferromagnetic layer is perpendicular to the wafer surface.

* * * * *